United States Patent
Tanihira

(10) Patent No.: US 9,768,759 B2
(45) Date of Patent: Sep. 19, 2017

(54) CLOCK GENERATOR AND METHOD OF ADJUSTING PHASES OF MULTIPHASE CLOCKS BY THE SAME

(71) Applicant: MegaChips Corporation, Osaka (JP)

(72) Inventor: Izuho Tanihira, Chiba (JP)

(73) Assignee: MegaChips Corporation, Osaka (JP)

( * ) Notice: Subject to any disclaimer, the term of this patent is extended or adjusted under 35 U.S.C. 154(b) by 0 days.

(21) Appl. No.: 14/971,100

(22) Filed: Dec. 16, 2015

(65) Prior Publication Data

US 2016/0173075 A1 Jun. 16, 2016

(30) Foreign Application Priority Data

Dec. 16, 2014 (JP) ................. 2014-253754

(51) Int. Cl.
*H03K 3/00* (2006.01)
*H03K 5/15* (2006.01)
*H03K 3/03* (2006.01)

(52) U.S. Cl.
CPC ....... *H03K 5/15013* (2013.01); *H03K 3/0315* (2013.01); *H03K 5/15026* (2013.01)

(58) Field of Classification Search
CPC .......................... H03K 3/0315; H03K 5/15013
USPC ................................................. 327/291–299
See application file for complete search history.

(56) References Cited

U.S. PATENT DOCUMENTS

| 2010/0134170 A1* | 6/2010 | Wang | H03K 3/0322 327/288 |
| 2010/0149137 A1* | 6/2010 | Saito | H03K 3/0315 345/204 |
| 2012/0286830 A1* | 11/2012 | Burcea | H03L 7/085 327/115 |

FOREIGN PATENT DOCUMENTS

JP 2011-061325 A 3/2011

* cited by examiner

*Primary Examiner* — Thomas Skibinski
(74) *Attorney, Agent, or Firm* — Osha Liang LLP

(57) ABSTRACT

A clock generator that outputs multiphase clocks comprises a ring oscillator that includes a plurality of inverter circuits connected in a circular pattern and outputs, from the inverter circuits, clocks provided with a delay time based on a delay control signal, a first frequency divider that divides an injection clock by a first value and outputs the clock as a reference clock, a second frequency divider that divides one of the multiphase clocks by a second value and outputs the clock as a comparison clock, and a frequency comparator that compares frequencies of the reference clock and the comparison clock and output the delay control signal based on a result of the comparison. The ring oscillator is configured to adjust the delay time based on the delay control signal.

18 Claims, 12 Drawing Sheets

CLOCK GENERATOR AND METHOD OF ADJUSTING PHASES OF MULTIPHASE CLOCKS BY THE SAME

FIELD OF THE INVENTION

The present invention generally relates to a clock generator, and particularly, to a clock generator that outputs multiphase clocks.

BACKGROUND OF THE INVENTION

Conventionally, since multiphase clocks allow of accurate adjustment of a phase difference between clocks, and thus are generally used in semiconductor integrated circuits with high-speed transmission lines. The difficulty in using a full-rate single-phase clock for high-speed transmission lines has been increasing along with the increase in the speed of the clocks in recent years, and the role played by the multiphase clocks is important.

A ring oscillator is known as an example of a multiphase oscillator that generates multiphase clocks. The ring oscillator includes a plurality of inverter circuits circularly-connected. The ring oscillator oscillates at a frequency based on the delay time of the clock in each inverter circuit and based on the drive capability of the power that drives the inverter circuits, and the respective inverter circuits output clocks with different phases. As an example of a technique for controlling an oscillation frequency of a ring oscillator, an injection clock can be used. Such an injection clock is input to the ring oscillator, and a state of the output of the inverter circuits is forcibly shifted so as to synchronize the oscillation frequency of the ring oscillator with the frequency of the injection clock.

For example, Japanese Patent Publication No. 2011-61325 discloses a voltage control oscillation circuit that synchronizes the oscillation frequency with the frequency of the injection clock by using an injection locking function. The voltage control oscillator is a ring-oscillator-type voltage control oscillator including a plurality of unit cells that receive differential signals with opposite phases, and the circuit controls a load resistance value in the plurality of unit cells by external voltage to control the amount of delay of the differential signals. In the voltage control oscillator, each of the plurality of unit cells includes a variable load circuit that receives the external voltage through a control terminal, and at least one of the plurality of unit cells includes a switch for causing short circuit between output terminals based on an input signal injected from an input terminal.

However, in a case where such a conventional circuit controls and adjusts the phases of the multiphase clocks to be output, the frequencies of the multiphase clocks are also controlled in accordance with the control and the adjustment. Therefore, the conventional circuit cannot independently adjust the phases and the frequencies. Particularly, even if the conventional circuit controls the phases of the multiphase clocks, the conventional circuit cannot maintain the frequencies of the multiphase clocks constant.

Further, the conventional circuit controls load resistance values of the plurality of unit cells in order to control the phases and the frequencies of the multiphase clocks. Manufacturing variations of the load resistance values affect the control of the phases and the frequencies of the multiphase clocks. Therefore, accurate control is difficult in a semiconductor integrated circuit that operates at a significantly high speed.

An object of the present invention is to provide a clock generator that can independently control phases and frequencies of multiphase clocks.

More specifically, an object of the present invention is to provide a clock generator including a mode that can adjust only phases of multiphase clocks output by a multiphase oscillator.

Further, an object of the present invention is to provide a clock generator that can accurately control phases of multiphase clocks while maintaining frequencies of the multiphase clocks constant.

Moreover, an object of the present invention is to provide a clock generator that can accurately control phases of multiphase clocks without being affected by manufacturing variations of circuit elements.

SUMMARY OF THE INVENTION

The present invention for solving the problems includes the following technical features and matters used to specify the invention.

According to an aspect, the present invention provides a clock generator that generates and outputs multiphase clocks. The clock generator may comprise an injection clock generator that may generate an injection clock based on a predetermined system clock, a ring oscillator that includes a plurality of inverter circuits connected in a circular pattern and output, from the plurality of inverter circuits, clocks of the multiphase clocks provided with a predetermined delay time based on a predetermined delay control signal, a first frequency divider that may divide the injection clock by a first value and output the clock as a reference clock, a second frequency divider that may divide at least one of the multiphase clocks by a second value and output the clock as a comparison clock, and a frequency comparator that may compare a frequency of the reference clock and a frequency of the comparison clock and output the predetermined delay control signal based on a result of the comparison to the ring oscillator. The ring oscillator may be configured to adjust the predetermined delay time of each of the plurality of inverter circuits based on the predetermined delay control signal.

Each of the plurality of inverter circuits may receive one of the multiphase clocks output from the inverter circuit of a previous stage, provide the one clock with the predetermined delay time based on the predetermined delay control signal, and output the one clock provided with the predetermined delay time to the inverter circuit of a next stage.

The clock generator may further include a controller that may output a predetermined control signal. When the predetermined control signal output from the controller indicates a first mode, the frequency comparator may store the result of the comparison. Further, the ring oscillator may control frequencies of the multiphase clocks such that the frequencies of the multiphase clocks become substantially the same as a frequency of the injection clock.

The ring oscillator may control current flowing through each inverter circuit based on the predetermined delay control signal.

The ring oscillator may further include capacitive elements connected to each output terminals of the plurality of inverter circuits. The ring oscillator may control capacitances of the capacitive elements based on the predetermined delay control signal.

According to another aspect, the present invention may provide a clock generator comprising an injection clock generator that may generate an injection clock based on a predetermined system clock, a ring oscillator that may include a plurality of inverter circuits connected in a circular pattern and output, from the plurality of inverter circuits, clocks of the multiphase clocks provided with a predetermined delay time, an adjustment circuit that may adjust the predetermined delay time provided to each of the plurality of inverter circuits in the ring oscillator based on the injection clock generated by the injection clock generator and based on at least one of the multiphase clocks generated by the ring oscillator, and a controller that may selectively control operation in a first mode for outputting the multiphase clocks generated by the ring oscillator to the outside and operation in a second mode for adjusting the predetermined delay time provided to each of the plurality of inverter circuits by the adjustment circuit.

The adjustment circuit may include a frequency comparator that may compare a frequency of a reference clock based on the injection clock and a frequency of a comparison clock based on at least one of the multiphase clocks and output the predetermined delay control signal based on a result of the comparison to the ring oscillator.

The adjustment circuit may further include a first frequency divider that may divide the injection clock by a first value and output the clock as the reference clock, and a second frequency divider that may divide at least one of the multiphase clocks by a second value and output the clock as the comparison clock.

The controller may control, in the first mode, to output the injection clock to the ring oscillator and to output the multiphase clocks to the outside. Further, the controller may control, in the second mode, to output the injection clock to the adjustment circuit and to output at least one of the multiphase clocks to the adjustment circuit.

The controller may select the second mode before selecting the first mode.

The control unit may select the first mode when the result of the comparison indicates that the frequency of the comparison clock exceeds the frequency of the reference clock during the control of the operation in the second mode.

According to another aspect, the present invention may provide a method of adjusting phases of multiphase clocks output by a clock generator including a ring oscillator including a plurality of inverter circuits connected in a circular pattern. The method may comprise generating an injection clock based on a predetermined system clock, adjusting a predetermined delay time of the plurality of inverter circuits based on the injection clock, and controlling frequencies of the multiphase clocks output by the ring oscillator such that the frequencies of the multiphase clocks become substantially the same as a frequency of the injection clock. The adjusting the predetermined delay time of the plurality of inverter circuits may include comparing a frequency of a reference clock obtained by dividing the injection clock by a first value and a frequency of a comparison clock obtained by dividing at least one of the multiphase clocks output by the ring oscillator by a second value, outputting a predetermined delay control signal based on a result of the comparison to the ring oscillator, and determining the predetermined delay time of each of the plurality of inverter circuits based on the predetermined delay control signal. Further, the comparing, the outputting, and the determining are repeated until the frequency of the comparison clock exceeds the frequency of the reference clock.

According to another aspect, the present invention provides a method of adjusting phases of multiphase clocks output by a clock generator including a ring oscillator including a plurality of inverter circuits connected in a circular pattern. The method may include generating an injection clock based on a predetermined system clock, adjusting the predetermined delay time provided to each of the plurality of inverter circuits in the ring oscillator based on the injection clock and at least one of the multiphase clocks generated by the ring oscillator, outputting the injection clock to the ring oscillator after adjusting the predetermined delay time provided to each of the plurality of inverter circuits; controlling frequencies of the multiphase clocks based on a frequency of the injection clock output to the ring oscillator, and outputting the multiphase clocks with the controlled frequencies to the outside.

According to the present invention, the clock generator can independently control the phases and the frequencies of the multiphase clocks.

More specifically, according to the present invention, the clock generator can include the mode for adjusting only the phases of the multiphase clocks output by the multiphase oscillator.

According to the present invention, the clock generator can accurately control the phases of the multiphase clocks while maintaining the frequencies of the multiphase clocks constant.

According to the present invention, the clock generator can accurately control the phases of the multiphase clocks without being affected by the manufacturing variations.

Other technical features, objects, effects, and advantages of the present invention will become apparent from the following embodiments described with reference to the attached drawings.

DETAILED DESCRIPTION OF THE PREFERRED EMBODIMENTS

Embodiments of the present invention will now be described with reference to the drawings.

Figure 1:
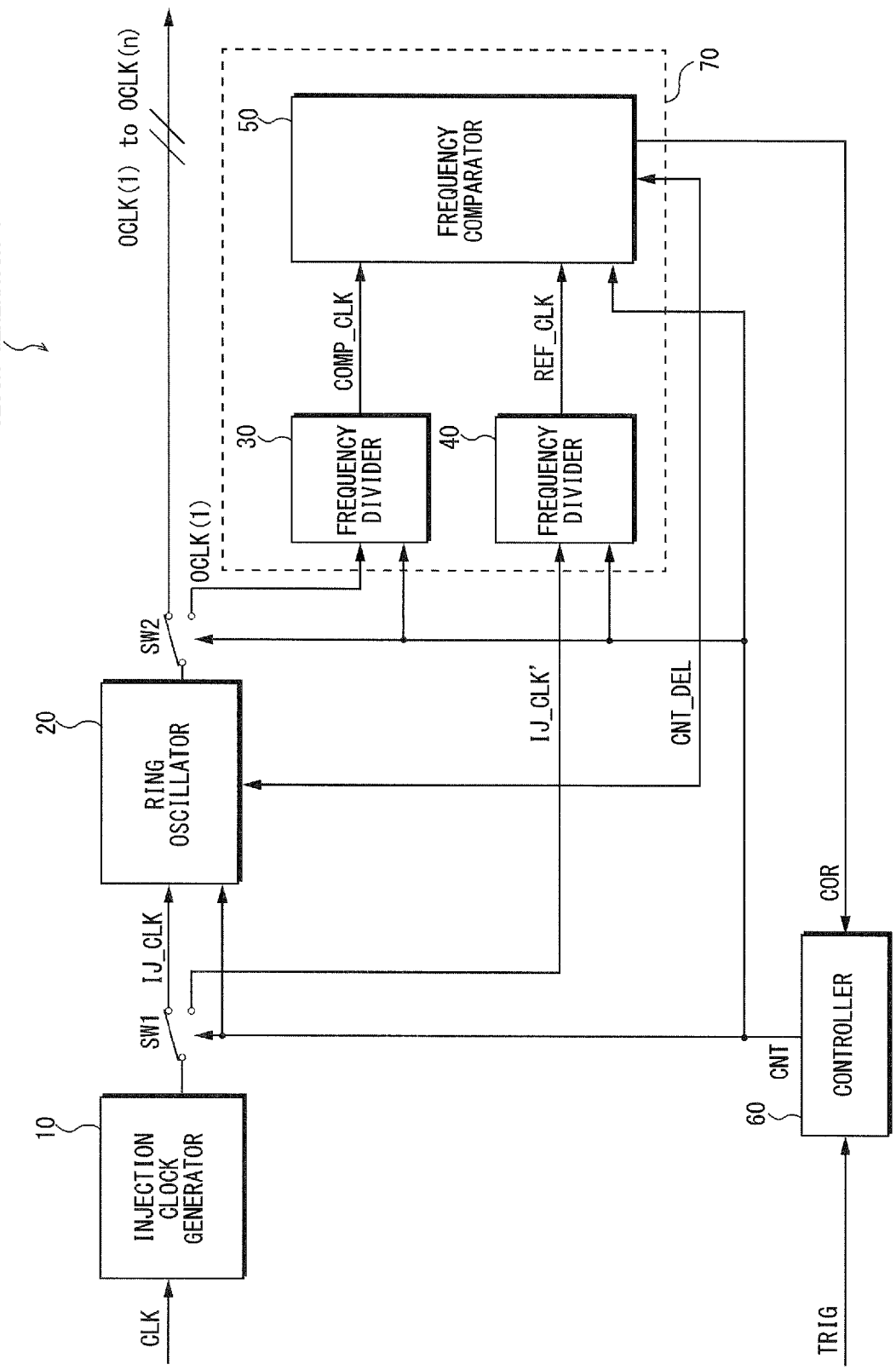
FIG. 1 is a block diagram showing an example of a schematic configuration of a clock generator according to an embodiment of the present invention.

FIG. 1 is a block diagram showing an example of a schematic configuration of a clock generator according to an embodiment of the present invention. As shown in FIG. 1, a clock generator 1 according to the present embodiment may be configured to include, for example, an injection clock generator 10, switches SW1 and SW2, a multiphase oscillator (ring oscillator) 20, frequency dividers 30 and 40, a frequency comparator 50, and a controller 60.

The injection clock generator 10 may generate a two-phase injection clock IJ_CLK based on a system clock CLK. Specifically, the injection clock generator 10 may generate the two-phase injection clock IJ_CLK based on the system clock CLK and output either the clock to the ring oscillator 20 or the frequency divider 40 through the switch SW1.

The switch SW1 may switch an output destination of the injection clock IJ_CLK output from the injection clock generator 10 in accordance with a control signal CNT. Specifically, when a state of the control signal CNT output from the controller 60 is a "tuning mode," the switch SW1 may output, as an injection clock IJ_CLK', the injection clock IJ_CLK output from the injection clock generator 10 to the frequency divider 40. On the other hand, when the state of the control signal CNT output from the controller 60 is an "injection locking mode," the switch SW1 may output the injection clock IJ_CLK output from the injection clock generator 10 to the ring oscillator 20.

The ring oscillator 20 may include n-stage (where n is an even number) inverter circuits INV (see FIG. 3) connected in a circular pattern, and output multiphase clocks OCLK(1) to OCLK(n) from the n-stage inverter circuits INV. Specifically, the ring oscillator 20 may control a delay time d of each of the stages based on a delay control signal CNT_DEL output from the frequency comparator 50. The ring oscillator 20 may generate the multiphase clocks OCLK(1) to OCLK (n) with phases in accordance with the delay time d, and output the generated clocks to the switch SW2.

The ring oscillator 20 may also control ON/OFF of the control of frequencies of the multiphase clocks OCLK(1) to OCLK(n) based on the injection clock IJ_CLK, in accordance with the control signal CNT output from the controller 60. When the control signal CNT indicates the "tuning mode," the ring oscillator 20 may not perform the control based on the injection clock IJ_CLK. The ring oscillator 20 may self-oscillate based on the delay time d in accordance with the delay control signal CNT_DEL output from the frequency comparator 50. On the other hand, when the control signal CNT indicates the "injection locking mode," the ring oscillator 20 may perforin the control based on the injection clock IJ_CLK, and control the frequencies of the multiphase clocks OCLK(1) to OCLK(n) in a period of the injection clock IJ_CLK.

Although the ring oscillator 20 may be used as the multiphase oscillator in this example, the multiphase oscillator is not limited to this, and another circuit that outputs multiphase clocks may be used. When such a circuit that outputs multiphase clocks is used as the multiphase oscillator, the multiphase oscillator may control the phase difference between the multiphase clocks OCLK(1) to OCLK (n) in accordance with the delay control signal CNT_DEL output from the frequency comparator 50, and then output the multiphase clocks OCLK(1) to OCLK(n) with the controlled phase difference.

The switch SW2 may switch the output destination of the multiphase clocks OCLK(1) to OCLK(n) output from the ring oscillator 20 based on the control signal CNT. Specifically, when the state of the control signal CNT output from the controller 60 is the "tuning mode," the switch SW2 may output the clock OCLK(1) of the multiphase clocks OCLK (1) to OCLK(n) output from the ring oscillator 20 to the frequency divider 30. On the other hand, when the state of the control signal CNT output from the controller 60 is the 'injection locking mode," the switch SW2 may output the multiphase clock OCLK(1) to OCLK(n) output from the ring oscillator 20 to the outside. Although the switch SW2 may output the clock OCLK(1) to the frequency divider 30 when the state of the control signal CNT is the "tuning mode" in this example, the arrangement is not limited to this. The switch SW2 may output an arbitrary clock OCLK to the frequency divider 30.

The frequency divider 30 may divide the clock OCLK(1) output from the ring oscillator 20 through the switch SW2 by a frequency division number M. Specifically, the frequency divider 30 may divide the clock OCLK(1) by the frequency division number M and may output, as a comparison clock COMP_CLK, the divided clock to the frequency comparator 50. When the state of the control signal CNT output from the controller 60 indicates the "injection locking mode," the frequency divider 30 may stop operating.

The frequency divider 40 may divide the injection clock IJ_CLK' output from the injection clock generator 10 by a frequency division number N. Specifically, the frequency divider 40 may divide the injection clock IJ_CLK' by the frequency division number N, and output, as a reference clock REF_CLK, the divided clock to the frequency comparator 50. When the state of the control signal CNT output from the controller 60 is the "injection locking mode," the frequency divider 40 may stop operating.

The frequency comparator 50 may compare the frequency of the comparison clock COMP_CLK and the frequency of the reference clock REF_CLK to generate the delay control signal CNT_DEL based on the comparison result, and output the signal to the ring oscillator 20. Specifically, the frequency comparator 50 may count a predetermined term based on the comparison clock COMP_CLK output from the frequency divider 30 and the reference clock REF_CLK output from the frequency divider 40. The predetermined term here may be a term with a length sufficient to measure the difference between the frequency of the reference clock REF_CLK and the frequency of the comparison clock COMP_CLK. When the frequency comparator 50 determines that the count value of the reference clock REF_CLK is greater than the count value of the comparison clock COMP_CLK, the frequency comparator 50 may generate the delay control signal CNT_DEL to reduce the delay of the inverter circuits NV of the ring oscillator 20 and may output the signal to the ring oscillator 20. On the other hand, when the frequency comparator 50 determines that the count value of the reference clock REF_CLK is not greater than the count value of the comparison clock COMP_CLK, the frequency comparator 50 may store the state of the delay control signal CNT_DEL, and output the signal to the ring oscillator 20. The frequency comparator 50 may also output a correspondence signal COR to the controller 60. When the control signal CNT output from the controller 60 indicates the "injection locking mode," the frequency comparator 50 may stop counting the reference clock REF_CLK and the comparison clock COMP_CLK. The frequency dividers 30 and 40 and the frequency comparator 50 may form an adjustment circuit 70.

The controller 60 may control the operation of the constituent elements in the clock generator 1. Specifically, the controller 60 may generate the control signal CNT that can be in one of the two states, the "tuning mode" and the "injection locking mode," and then output the signal to the ring oscillator 20, the frequency dividers 30 and 40, the switches SW1 and SW2, and the frequency comparator 50, respectively. For example, the controller 60 may detect a trigger signal TRIG input from the outside and set the state of the control signal CNT to the "tuning mode" based on the trigger signal. The controller 60 may then output the signal to the ring oscillator 20, the frequency dividers 30 and 40, the switches SW1 and SW2, and the frequency comparator 50, respectively. In the "tuning mode," the controller 60 may determine the state of the correspondence signal COR output from the frequency comparator 50. When the state of the correspondence signal COR indicates that the frequency comparator 50 has stored the state of the delay control signal CNT_DEL, the controller 60 may change the state of the control signal CNT to the "injection locking mode," and then output the signal to the ring oscillator 20, the frequency dividers 30 and 40, the switches SW1 and SW2, and the frequency comparator 50, respectively.

The clock generator 1 with the configuration as discussed above may adjust a frequency of a comparison clock COMP_CLK to a frequency of the reference clock REF_CLK, and adjust a delay time d of each stage of the ring oscillator 20 to a desired time to thereby control phases of the multiphase clocks OCLK(1) to OCLK(n). The clock generator may then control the frequencies of the multiphase clocks OCLK(1) to OCLK(n) output by the ring oscillator 20, to a period of the injection clock IJ_CLK. By this way, the clock generator 1 may accurately control the phases of the multiphase clocks OCLK(1) to OCLK(n) while maintaining the frequencies of the multiphase clocks OCLK(1) to OCLK(n) constant. Since the clock generator 1 may determine the phase difference between the multiphase clocks OCLK(1) to OCLK(n) based on the ratio of the frequency division numbers N and M of the frequency dividers 30 and 40, the clock generator 1 may accurately control the phases of the multiphase clocks OCLK(1) to OCLK(n) without being affected by manufacturing variations.

Figure 2:
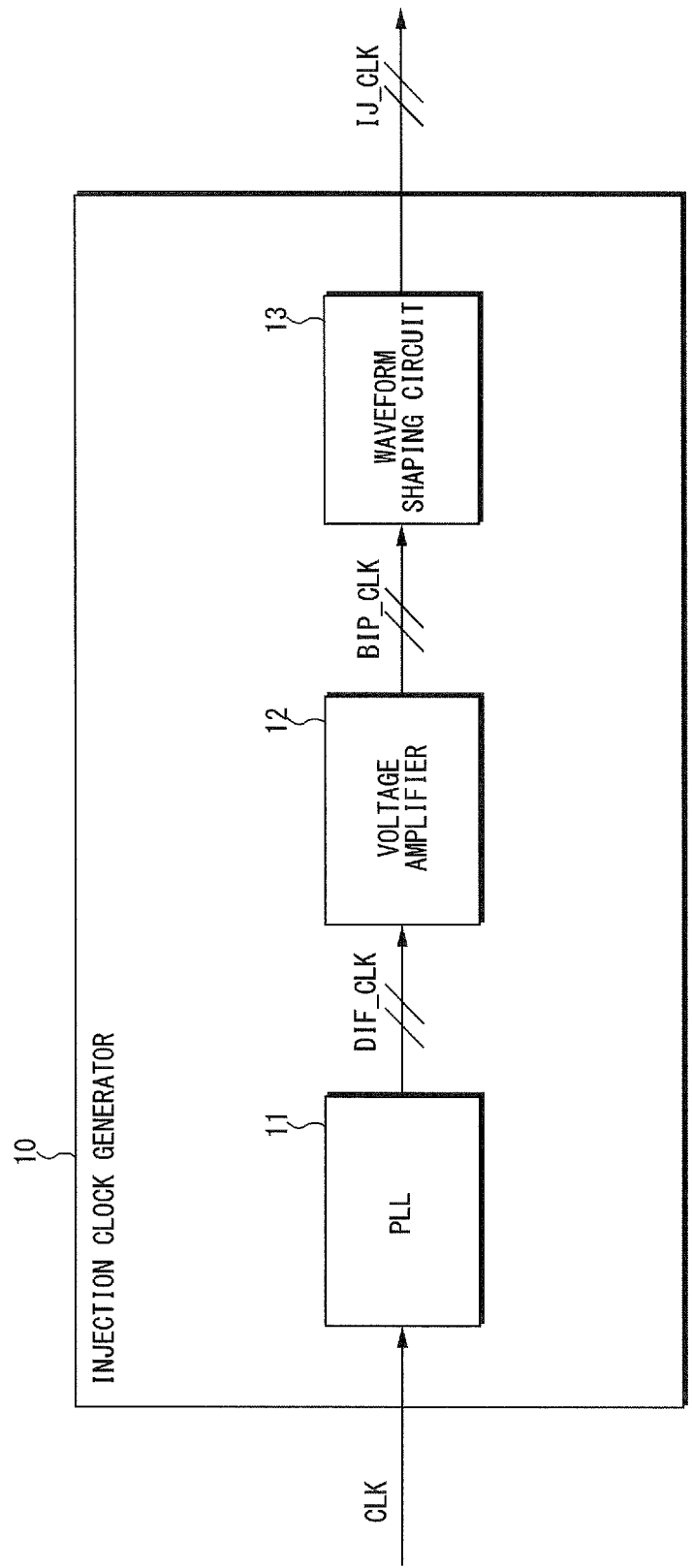
FIG. 2 is a block diagram showing an example of an injection clock generator in a clock generator according to an embodiment of the present invention.

FIG. 2 is a block diagram showing an example of an injection clock generator in a clock generator according to an embodiment of the present invention. As shown in FIG. 2, the injection clock generator 10 may be configured to include a PLL (Phase-Locked-Loop) 11, a voltage amplifier 12, and a waveform shape circuit 13.

The PLL 11, which may be a phase synchronization circuit as generally used, may be configured to generate a differential clock DIF_CLK based on the system clock CLK. Specifically, the PLL 11 may generate the differential clock DIF_CLK with a desired frequency based on the system clock CLK, and output the generated differential clock DIF_CLK to the voltage amplifier 12. The frequency of the differential clock DIF_CLK may serve as the frequencies of the multiphase clocks OCLK(1) to OCLK(n) in the injection locking mode.

The voltage amplifier 12 may amplify the voltage of the differential clock DIF_CLK to a desired voltage, and output the clock as a two-phase clock BIP_CLK. Specifically, the voltage amplifier 12 may amplify the voltage of the differential clock DIF_CLK output from the PLL 11 to a desired voltage, and then output the clock as the two-phase clock BIP_CLK to the waveform shape circuit 13. The voltage of the two-phase clock BIP_CLK may serve as a voltage of the injection clock IJ_CLK.

The waveform shaping circuit 13 may shape the waveform of the two-phase clock BIP_CLK into a desired waveform, and output the clock as a two-phase injection clock IJ_CLK. Specifically, the waveform shaping circuit 13 may adjust the duty ratio and the skew of the two-phase clock BIP_CLK output from the voltage amplifier 12. The waveform shaping circuit 13 may then output, as the two-phase injection clock IJ_CLK, the clock with the adjusted duty ratio and skew to the ring oscillator 20 or the frequency divider 40.

The injection clock generator 10 with the configuration as discussed above may generate the two-phase injection clock IJ_CLK with the desired voltage and frequency based on the system clock CLK, and then output the generated clock to the ring oscillator 20 or the frequency divider 40.

Figure 3:
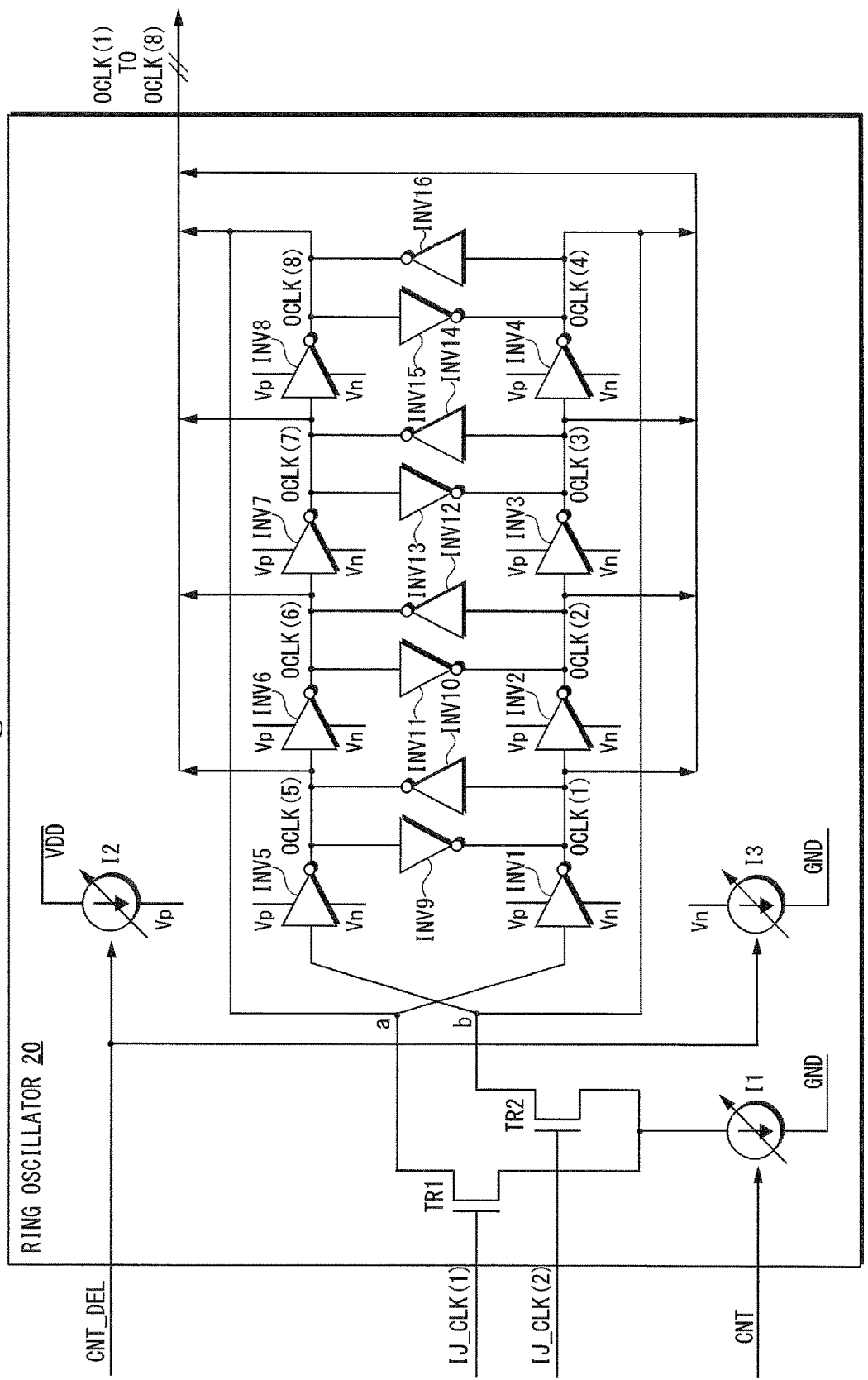
FIG. 3 is a circuit diagram showing an example of a ring oscillator in a clock generator according to an embodiment of the present invention.

FIG. 3 is a circuit diagram showing an example of a ring oscillator in a clock generator according to an embodiment of the present invention. As shown in FIG. 3, the ring oscillator 20 may be configured to include transistors TR1 and TR2, current sources I1 to I3, and inverter circuits INV1 to INV16.

In FIG. 3, positive and negative clocks of the injection clock IJ_CLK are defined as injection clocks IJ_CLK(1) and IJ_CLK(2), respectively. Further, a node connecting the inverter circuits INV1 and INV8 with the transistor TR1 is defined as a node a, and a node connecting the inverter circuits INV4 and INV5 with the transistor TR2 is defined as a node b. Although eight-phase multiphase clocks OCLK(1) to OCLK(8) may be output from the inverter circuits INV1 to INV8 in this example, the arrangement is not limited to this, and an arbitrary number of multiphase clocks OCLK(1) to OCLK(n) may be output from a corresponding arbitrary number of inverter circuits INV1 to INVn.

The current source I1 may be, for example, a MOS transistor. The current source I1 may supply a predetermined current to the transistors TR1 and TR2 in accordance with the control signal CNT output from the controller 60. Specifically, when the state of the control signal CNT is the "tuning mode," the current source I1 may stop supplying the current to the transistors TR1 and TR2. On the other hand, when the state of the control signal CNT is the "injection locking mode," the current source I1 may supply the predetermined current to the transistors TR1 and TR2. One end of the current source I1 may be connected to the sources of the transistors TR1 and TR2, and the other end thereof may be connected to a grounding line GND. The control terminal of the current source I1 may be connected to the controller 60.

The transistor TR1 may be, for example, an N-type MOS transistor. The transistor TR1 may control the potential (i.e., state) of the node a according to the injection clock IJ_CLK(1) output from the injection clock generator 10. The source of the transistor TR1 may be connected to the source of the transistor TR2 and to the current source I1. The drain of the transistor TR1 may be connected to the input terminals of the inverter circuits INV1 and INV15 and to the output terminals of the inverter circuits INV8 and INV16 through the node a. The gate of the transistor TR1 may be connected to the injection clock generator 10.

The transistor TR2 may be, for example, an N-type MOS transistor. The transistor TR2 may control the potential (i.e. state) of the node b in accordance with the injection clock IJ_CLK(2) output from the injection clock generator 10. The source of the transistor TR2 may be connected to the source of the transistor TR1 and to the current source I1. The drain of the transistor TR2 may be connected to the input terminals of the inverter circuits INV5 and INV16 and to the output terminals of the inverter circuits INV4 and INV15 through the node b. The gate of the transistor TR2 may be connected to the injection clock generator 10.

The current source I2 may be, for example, a MOS transistor. The current source I2 may supply the inverter circuits INV1 to INV8 with the current in which the current value is adjusted according to the delay control signal CNT_DEL output from the frequency comparator 50. One end of the current source I2 may be connected to a power line VDD, and the other end thereof may be connected to power terminals Vp of the inverter circuits INV1 to INV8. The control terminal of the current source I2 may be connected to the frequency comparator 50.

The current source I3 may be, for example, a MOS transistor. The current source I3 may extract, from the inverter circuits INV1 to INV8, the current in which the current value is adjusted according to the delay control signal CNT_DEL output from the frequency comparator 50. One end of the current source I3 may be connected to grounding terminals Vn of the inverter circuits INV1 to INV8, and the other end thereof may be connected to a grounding line GND. The control terminal of the current source I3 may be connected to the frequency comparator 50.

The inverter circuits INV1 to INV8 may be, for example, logical NOT circuits. The inverter circuits INV1 to INV8 may be connected in a circular pattern so as to receive the output from the inverter circuit INV of the previous stage to logically negate the output and to output it to the inverter circuit INV of the next stage.

Specifically, the inverter circuit INV1 may logically negate the clock OCLK(8) output from the inverter circuit INV8 of the previous stage, and provide the delay time d according to the current supplied from the current source I2 through the power terminal Vp and in accordance with the current extracted from the current source I3 through the grounding terminal Vn. The inverter circuit INV1 may output, as the clock OCLK(1), the result of the process to the inverter circuit INV2 of the next stage, to the inverter circuit INV10 described later, and to the outside. The operation of the inverter circuits INV2 to INV8 may be similar to that of the inverter circuit INV1, and thus the description will be omitted.

The inverter circuits INV9 to INV16 may be, for example, logical NOT circuits. The inverter circuits INV9 to INV16 may be arranged between pairs of output signal lines of the inverter circuits INV1 to INV8 with inverted phases. Each of the inverter circuits INV9 to INV16 may logically negate the output of one of the pair of inverter circuits INV and may output the result of the logical negation to the inverter circuit INV on the next stage of the other of the pair of inverter circuits NV to thereby synchronize the timings of the outputs of the pair of inverter circuits INV.

Specifically, the inverter circuit INV10 may logically negate the clock OCLK(1) output from the inverter circuit INV1, and output the result of the logical negation to the inverter circuit INV6 of the next stage of the inverter circuit INV5 forming a pair with the inverter circuit INV1. The inverter circuit INV9 may logically negate the clock OCLK (5) output from the inverter circuit INV5, and output the result of the logical negation to the inverter circuit INV2 of the next stage of the inverter circuit INV1 forming a pair with the inverter circuit INV5. By this way, the timings of the outputs of the inverter circuits INV1 and INV5 may be synchronized. The operation of the inverter circuits INV11 to INV16 may be similar to that of the inverter circuits INV9 and INV10, and thus the description will be omitted.

The ring oscillator 20 with the configuration as discussed above may generate the multiphase clocks OCLK(1) to OCLK(8) based on the circular configuration of the inverter circuits INV1 to INV8, and then output the clocks. Each inverter circuit INV of the ring oscillator 20 may logically negate the clock OCLK input to the inverter circuit INV, and provide the delay time d according to the delay control signal CNT_DEL. The inverter circuit NV may then output the clock OCLK to the inverter circuit INV of the next stage and to the outside. By this way, the phase of each of the multiphase clocks OCLK(1) to OCLK(8) may be determined by the delay control signal CNT_DEL. The ring oscillator 20 may also control ON/OFF of the control of the frequencies of the multiphase clocks OCLK(1) to OCLK(8) based on the injection clock IJ_CLK in accordance with the control signal CNT.

Figure 4:
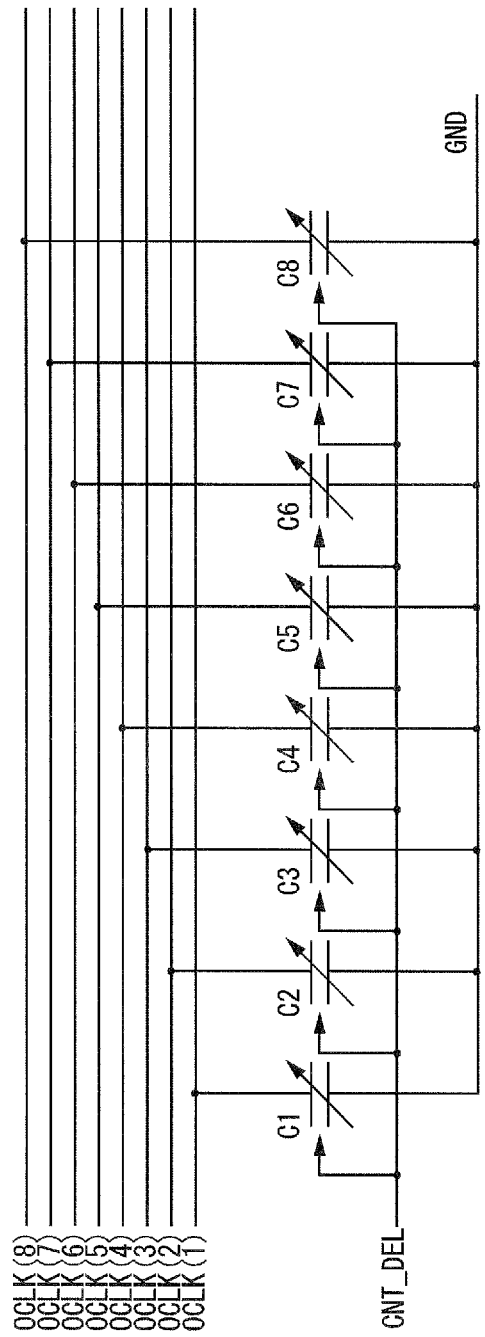
FIG. 4 is a block diagram showing an example of configuration of output signal lines of a ring oscillator according to an embodiment of the present invention.

FIG. 4 is a circuit diagram showing an example of output signal lines of a ring oscillator according to an embodiment of the present invention. As shown in FIG. 4, the output signal lines of the ring oscillator 20 according to the present embodiment may further include capacitive elements C1 to C8 in addition to the constituent elements described in FIG. 3.

The capacitive elements C1 to C8 may be, for example MOS capacitors. The capacitive elements C1 to C8 may be arranged between the output terminals of the inverter circuits INV1 to INV8 and the grounding line GND and may be configured to provide delay time to the multiphase clocks OCLK(1) to OCLK(8) output by the inverter circuits INV1 to INV8. The values of the capacitances of the capacitive elements C1 to C8 may be controlled in accordance with the delay control signal CNT_DEL output from the frequency comparator 50.

The control of the delay time d of each stage of the ring oscillator 20 may be achieved by controlling the amount of current of the current sources I2 and I3 as shown in FIG. 3, or otherwise may be achieved by changing the capacitance values of the capacitive elements C1 to C8 connected to the output terminals of the inverter circuits INV1 to INV8 as shown in FIG. 4. Moreover, the control may be achieved by carrying out both.

[Description of Operation in Tuning Mode]

Figure 5:
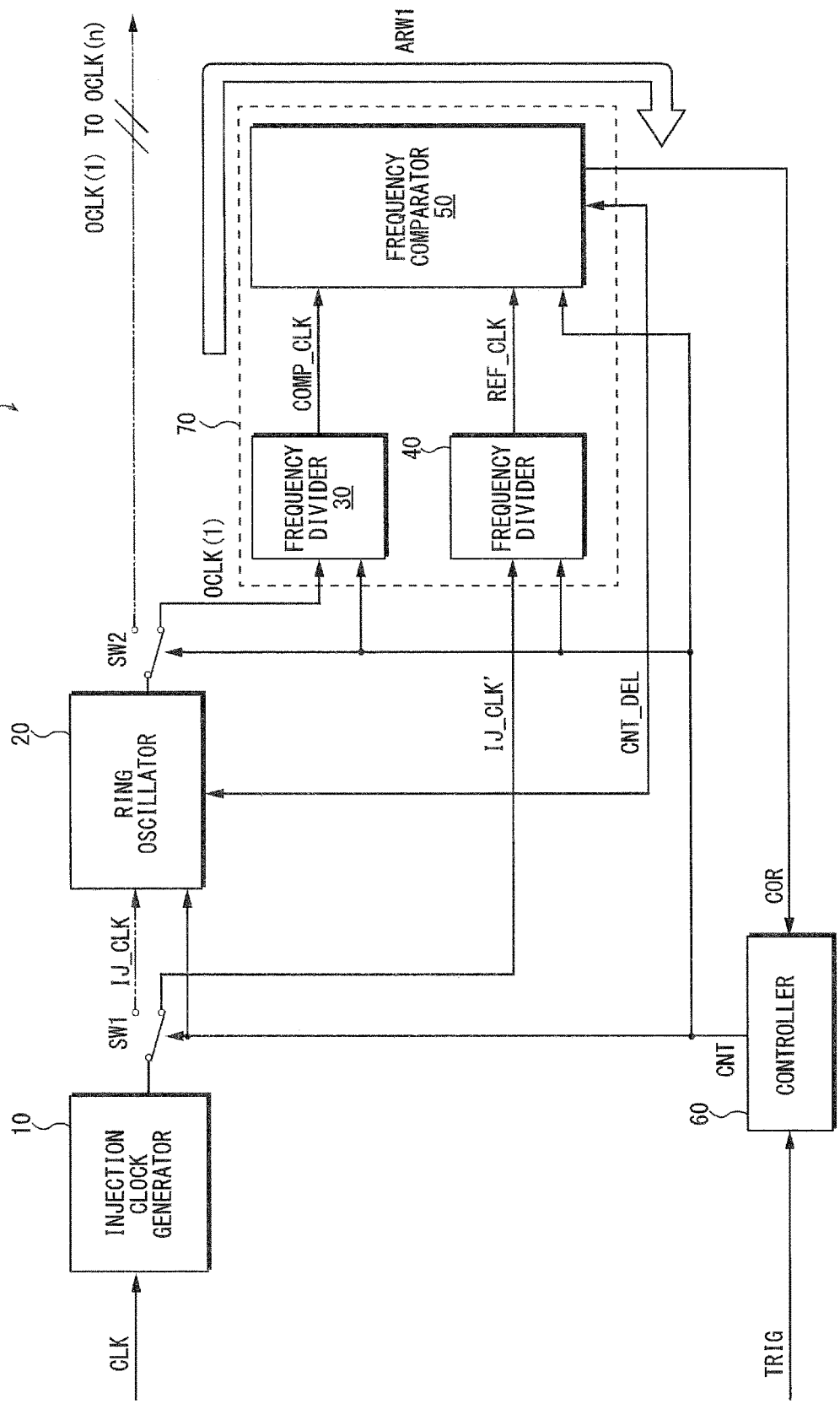
FIG. 5 is a block diagram showing an example of operation of a clock generator in a tuning mode according to an embodiment of the present invention.

FIG. 5 is a block diagram showing an example of operation of a clock generator in a tuning mode according to an embodiment of the present invention. As shown in FIG. 5, the controller 60 may output a control signal CNT indicating a state of a tuning mode to the ring oscillator 20, the frequency dividers 30 and 40, the switches SW1 and SW2, and the frequency comparator 50, respectively.

The switch SW1 may output, as the injection clock IJ_CLK', the injection clock IJ_CLK output from the injection clock generator 10 to the frequency divider 40. As a result, the injection clock IJ_CLK to the ring oscillator 20 may not be supplied to the ring oscillator 20.

The ring oscillator 20 may then stop control of the frequencies of the multiphase clocks OCLK(1) to OCLK(8) in response to the injection clock IJ_CLK. The ring oscillator 20 may start self-oscillation based on a delay time d of each stage of the ring oscillator 20.

Then, the switch SW2 may output the clock OCLK(1) output from the ring oscillator 20 to the frequency divider 30. As a result, the multiphase clocks OCLK(1) to OCLK(8) may not be supplied to the outside.

The frequency divider 30 may divide the clock OCLK(1) output from the ring oscillator 20 by the frequency division number M, and then output, as a comparison clock COMP_CLK, the divided clock to the frequency comparator 50.

Further, the frequency divider 40 may divide the injection clock IJ_CLK' output from the injection clock generator 10 by the frequency division number N, and output, as a reference clock REF_CLK, the divided clock to the frequency comparator 50.

The frequency comparator 50 may start counting the predetermined term based on the comparison clock COMP_CLK and the reference clock REF_CLK. The frequency comparator 50 may change a state of a delay control signal CNT_DEL until the count value of the comparison clock COMP_CLK is equal to or greater than the count value of the reference clock REF_CLK so as to reduce the delay time d of each stage of the ring oscillator 20. The frequency comparator 50 may repeat outputting the changed signal to the ring oscillator 20 (arrow ARW1 in FIG. 5).

When the frequency comparator 50 determines that the count value of the comparison clock COMP_CLK is equal to or greater than the count value of the reference clock REF_ CLK, the frequency comparator 50 may store the state of the delay control signal CNT_DEL, and output a correspondence signal COR to the controller 60 to notify the controller 60 of the end of the operation in the "tuning mode." By this way, the delay time d of each stage of the ring oscillator 20 may be adjusted, and the phases of the multiphase clocks OCLK(1) to OCLK(8) may be adjusted.

[Description of Operation in Injection Lock Mode]

Figure 6:
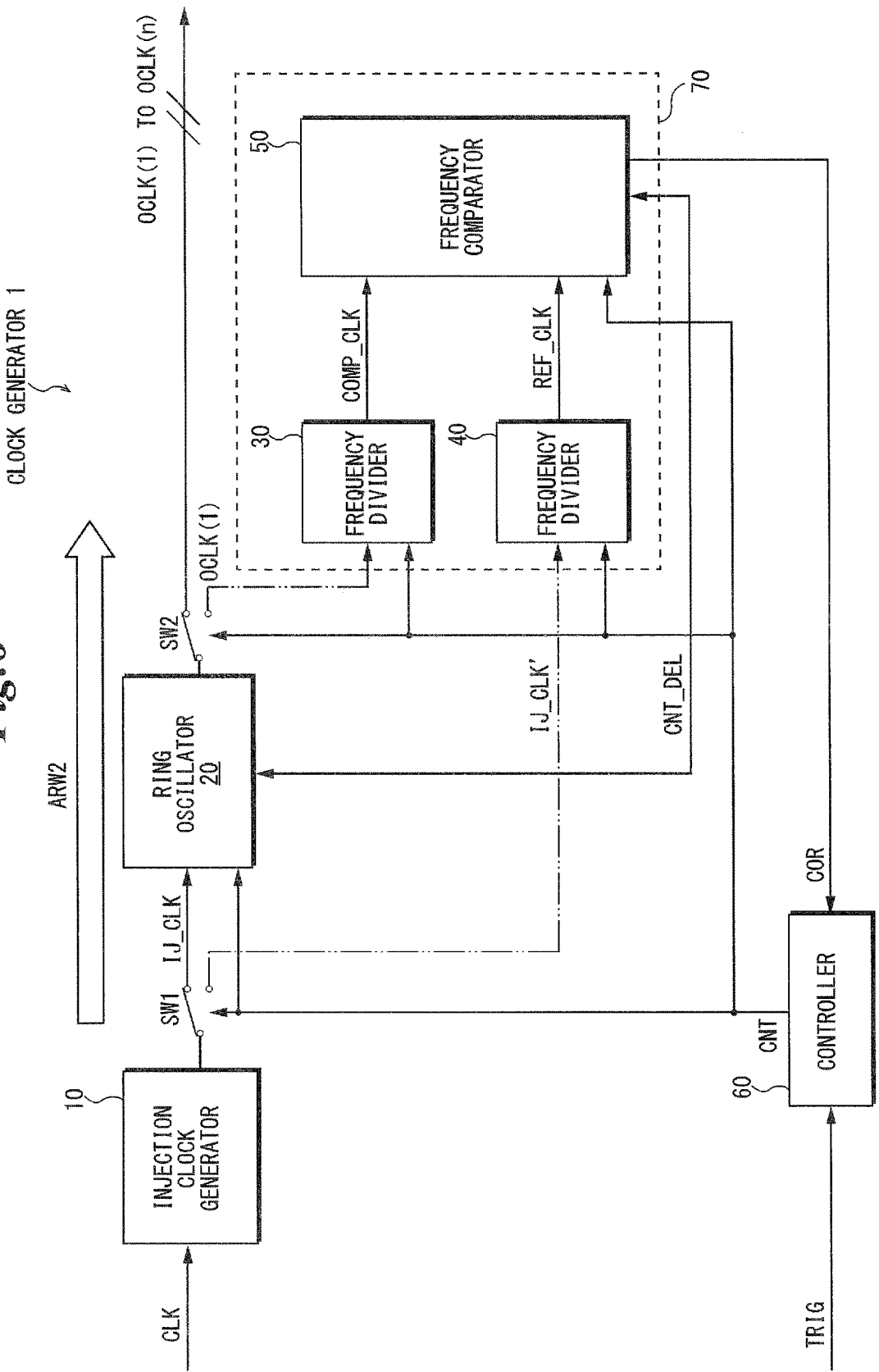
FIG. 6 is a block diagram showing an example of operation of a clock generator in an injection locking mode according to an embodiment of the present invention.

FIG. 6 is a block diagram showing an example of operation of a clock generator in an injection locking mode according to an embodiment of the present invention. As shown in FIG. 6, when a correspondence signal COR is input from the frequency comparator 50, the controller 60 may output a control signal CNT indicating a state of the injection locking mode to the ring oscillator 20, the frequency dividers 30 and 40, the switches SW1 and SW2, and the frequency comparator 50, respectively.

The switch SW1 may output an injection clock IJ_CLK output from the injection clock generator 10 to the ring oscillator 20. As a result, the injection clock IJ_CLK' to the frequency divider 40 may not be supplied to the frequency divider 40.

The switch SW2 may output multiphase clocks OCLK(1) to OCLK(n) output from the ring oscillator 20 to the outside. As a result, the clock OCLK(1) to the frequency divider 30 may not be supplied to the frequency divider 30. The frequency dividers 30 and 40 may stop operating.

The frequency comparator 50 may stop the count operation of a comparison clock COMP_CLK and a reference clock REF_CLK, and store the state of the delay control signal CNT_DEL.

The ring oscillator 20 may start the control of the frequencies of the multiphase clocks OCLK(1) to OCLK(8) based on the injection clock IJ_CLK. As a result, the ring oscillator 20 may generate the multiphase clocks OCLK(1) to OCLK(8) having phases in accordance with the delay control signal CNT_DEL and oscillating at the frequencies according to the injection clock IJ_CLK, and then output the clocks to the outside (arrow ARW2 in FIG. 6).

Figure 7:
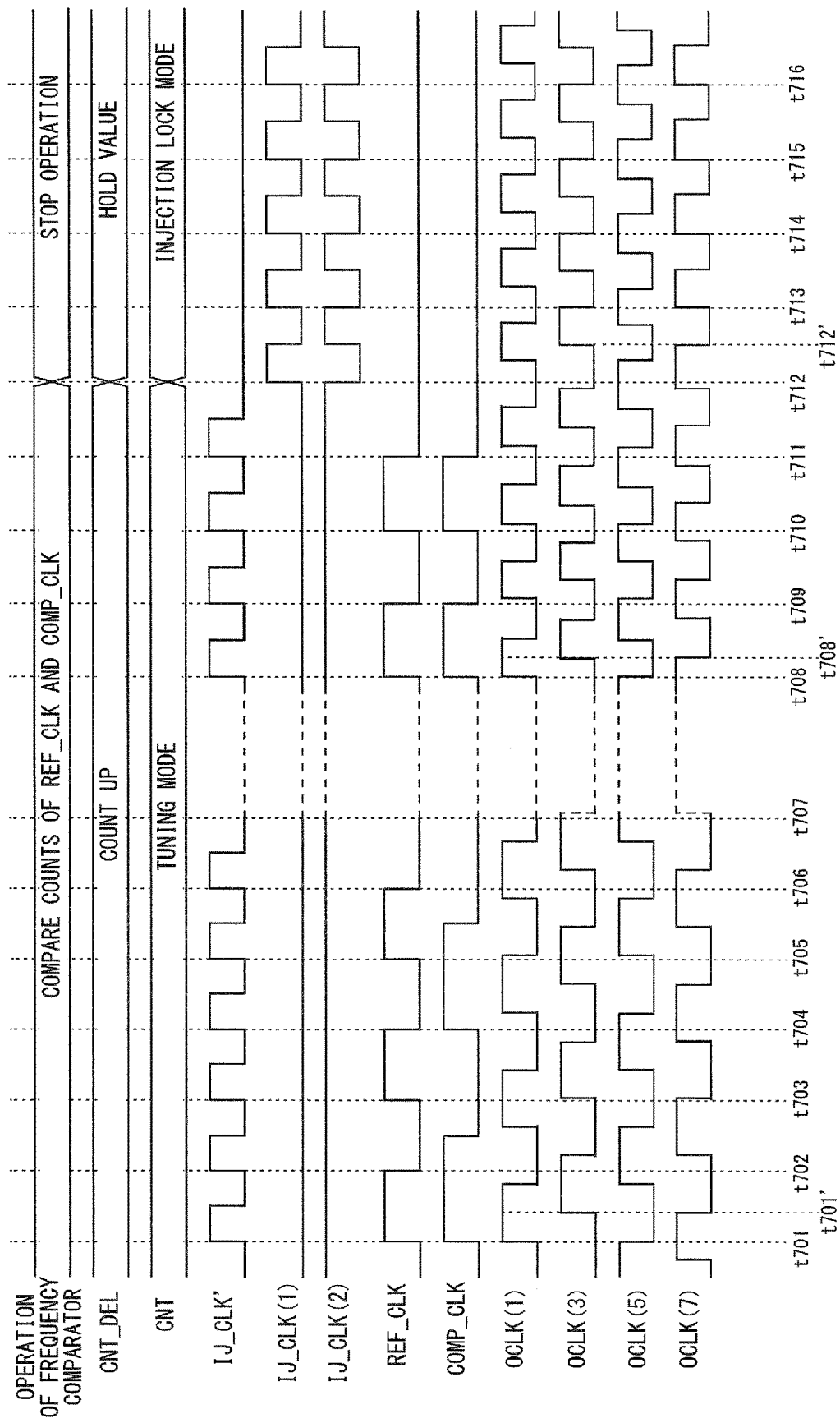
FIG. 7 is a timing chart showing operation of a clock generator according to an embodiment of the present invention.

FIG. 7 is a timing chart showing operation of a clock generator according to an embodiment of the present invention. In FIG. 7, timings of an alternation of injection clocks IJ_CLK and IJ_CLK' are defined as times t701 to t716. A timing of a first alternation of a clock OCLK(3) after the time t701 is defined as a time t701'. A timing of a first alternation of the clock OCLK(3) after the time t708 is defined as a time t708'. A timing of a first alternation of the clock OCLK(3) after the time t712 is defined as a time t712'. In FIG. 7, it is assumed that the multiphase clocks OCLK include eight phases.

At the times t701 to t707, the controller 60 may set a state of a control signal CNT to the "tuning mode" and output the control signal CNT. As a result, the switch SW1 may output, as the injection clock IJ_CLK', the injection clock IJ_CLK output from the injection clock generator to the frequency divider 40. Therefore, the frequency dividers 30 and 40 may start dividing the clock OCLK(1) and the injection clock IJ_CLK', respectively, and the frequency comparator 50 may start comparing a count of a reference clock REF_CLK and a count of a comparison clock COMP_CLK. The frequency of the reference clock REF_CLK may be greater than the frequency of the comparison clock COMP_CLK at the times t701 to t707, and the frequency comparator 50 may count up a value of a delay control signal CNT_DEL to reduce a delay time d of each stage of the ring oscillator 20.

The ring oscillator 20 may start self-oscillation in accordance with the state "tuning mode" of the control signal CNT, without controlling the frequencies based on the injection clocks IJ_CLK(1) and IJ_CLK(2). The ring oscillator 20 may control the delay time d of each stage according to the delay control signal CNT_DEL, and then self-oscillate. Therefore, the ring oscillator 20 may gradually increase the frequencies of the multiphase clocks OCLK(1) to OCLK (8) at the times t701 to t707.

At the times t708 to t711, the controller 60 may maintain the "tuning mode" of the control signal CNT and output the signal. The frequency comparator 50 may compare the frequencies of the reference clock REF_CLK and the comparison clock COMP_CLK. At the time t710, the frequency of the reference clock REF_CLK may be smaller than the frequency of the comparison clock COMP_CLK. Therefore, the frequency comparator 50 may store the state of the delay control signal CNT_DEL, and output a correspondence signal COR to the controller 60 to notify the controller 60 of the end of the operation in the tuning mode. At the time t710, the ring oscillator 20 may output the multiphase clocks OCLK(1) to OCLK(8) in which the term between the time t708 and the time 708' is the phase difference.

At the time t712, the controller 60 may set the state of the control signal CNT to the "injection locking mode," and output the signal. As a result, the switch SW1 may switch the output of the switch SW1 to the ring oscillator 20. The frequency comparator 50 may stop the counting, and store the state of the delay control signal CNT_DEL. The frequency dividers 30 and 40 may stop operating. At the times t712 to t716, the ring oscillator 20 may output the multiphase clocks OCLK(1) to OCLK(8) having delays equivalent to the term between the time t708 and the time t708' and having periods of the injection clock IJ_CLK(1) and IJ_CLK(2).

Figure 8:
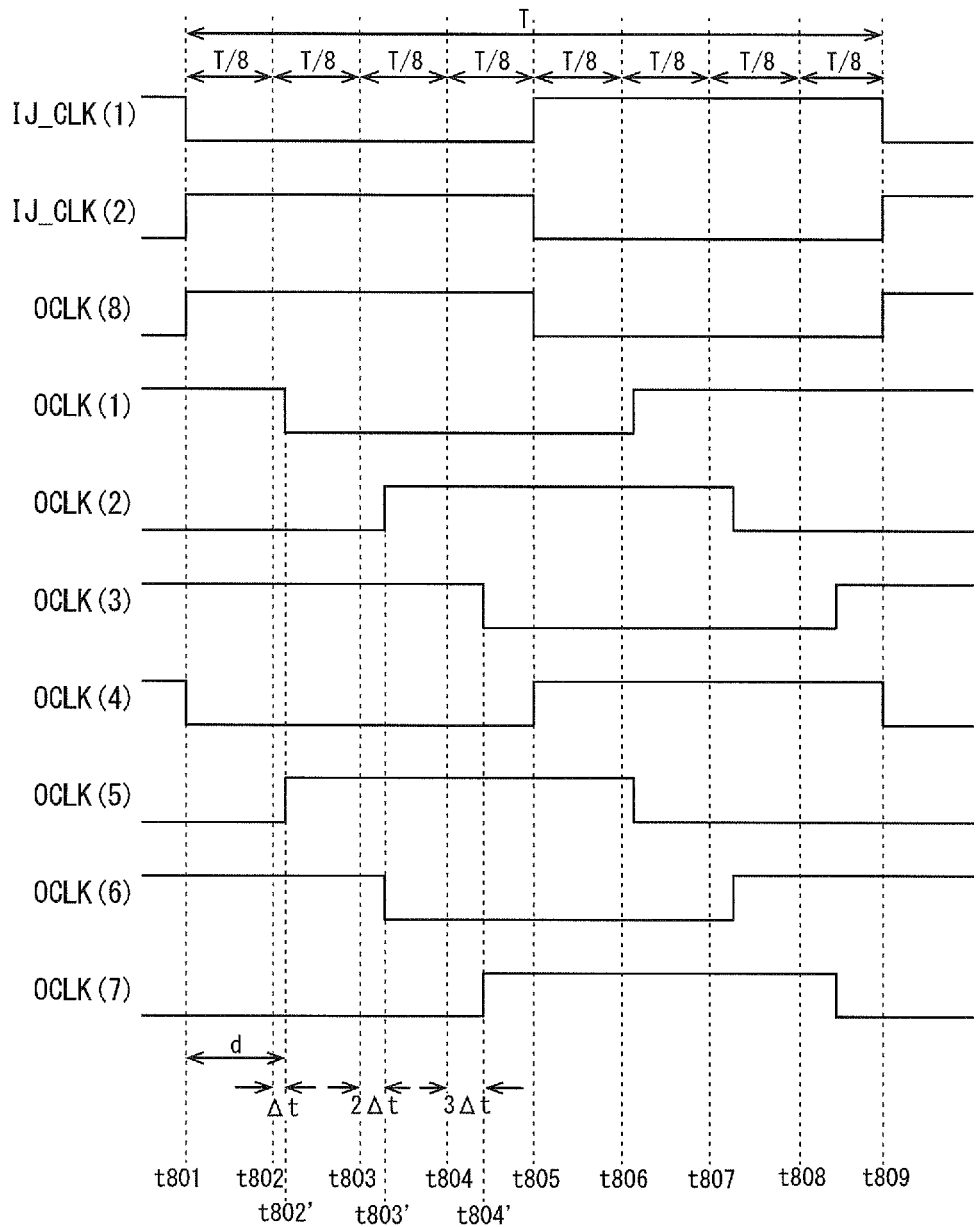
FIG. 8 is a timing chart showing the operation of a clock generator in the injection locking mode according to an embodiment of the present invention.

FIG. 8 is a timing chart showing operation of a clock generator in the injection locking mode according to an embodiment of the present invention. In FIG. 8, it is assumed that the multiphase clocks OCLK include eight phases. Timings in which phase differences from the clock OCLK(8) are 0°, 45°, 90°, 135°, 180°, 225°, 270°, 315°, and 360° are defined as times t801 to t809, respectively. Timing of a first alternation of the clock OCLK(1) after the time t802 is defined as a time t802'. Timing of a first alternation of the clock OCLK(2) after the time t803 is defined as a time t803'. Timing of a first alternation of the clock OCLK(3) after the time t804 is defined as a time t804'. It is assumed that each stage of the ring oscillator 20 has the delay time d, and it is assumed that the injection clock IJ_CLK has a period T.

The transistor TR1 may raise the clock OCLK(8) at the time t801 based on the injection clock IJ_CLK(1).

In response to the rise of the clock OCLK(8) at the time t801, the inverter circuits INV1 and INV9 may logically negate the clock and provide a predetermined delay time d to the clock. The inverter circuits INV1 and INV9 may output the clock as the clock OCLK(1) at the rise of the clock OCLK(5). More specifically, the inverter circuits INV1 and INV9 may lower the clock OCLK(1) at the time t802' that is the delay time d after the time t801. The thus generated clock OCLK(1) may have a delay equivalent to a delay difference Δt (hereinafter, referred to as "delay difference Δt") based on the frequency dividing ratio, in addition to T/8 from the clock OCLK(8). The delay difference Δt may be a time obtained by subtracting a time equivalent to ⅛ of the period T from the delay time d.

In response to the fall of the clock OCLK(1) at the time 1802', the inverter circuits INV2 and INV11 may logically negate the clock and provide the predetermined delay time d to the clock. The inverter circuits INV2 and INV11 may output the clock as the clock OCLK(2) at the fall of the clock OCLK(6). More specifically, the inverter circuits INV2 and INV11 may raise the clock OCLK(2) at the time t803' that is the delay time d after the time t802'. The generated clock OCLK(2) may have a delay equivalent to the delay difference Δt×2, in addition to 2×T/8 from the clock OCLK(8).

In response to the rise of the clock OCLK(2) at the time t803', the inverter circuits INV3 and INV13 may logically negate the clock and provide the predetermined delay time d to the clock. The inverter circuits INV3 and INV13 may output the clock OCLK(3) at the rise of the clock OCLK(7). More specifically, the inverter circuits INV3 and INV13 may lower the clock OCLK(3) at the time t804' that is the delay time d after the time t803'. The generated clock OCLK(3) may have a delay equivalent to the delay difference Δt×3, in addition to 3×T/8 from the clock OCLK(8).

The inverter circuit INV4 may raise the clock OCLK(4) at the time t805 based on the operation of the transistor TR2. The clocks OCLK(5) to OCLK(8) may alternate in the same manner as the clocks OCLK(1) to OCLK(4), respectively, based on the operation of the transistor TR2, and thus the description of the transition of the state will be omitted.

As described above, the clock generator 1 may adjust the frequency of the self-oscillation of the ring oscillator 20 in the tuning mode to adjust the phases of the multiphase clocks OCLK(1) to OCLK(3) and OCLK(5) to OCLK(7) to desired phases. The clock generator 1 may adjust the frequencies of the multiphase clocks OCLK(1) to OCLK(8) to the period of the injection clock IJ_CLK in the injection locking mode to accurately control the phases of the multiphase clocks OCLK(1) to OCLK(8) while maintaining the frequencies constant. Since the clock generator 1 may determine the phase difference between the multiphase clocks OCLK(1) to OCLK(8) based on the ratio of the frequency division numbers M and N of the frequency dividers 30 and 40, the clock generator 1 may accurately control the phases of the multiphase clocks OCLK(1) to OCLK(8) without being affected by manufacturing variations. The clock generator 1 may include the tuning mode for controlling the phases of the multiphase clocks output by the ring oscillator 20 and the injection locking mode for controlling the frequencies of the multiphase clocks. The clock generator 1 may perform the control by switching these two modes.

Figure 9:
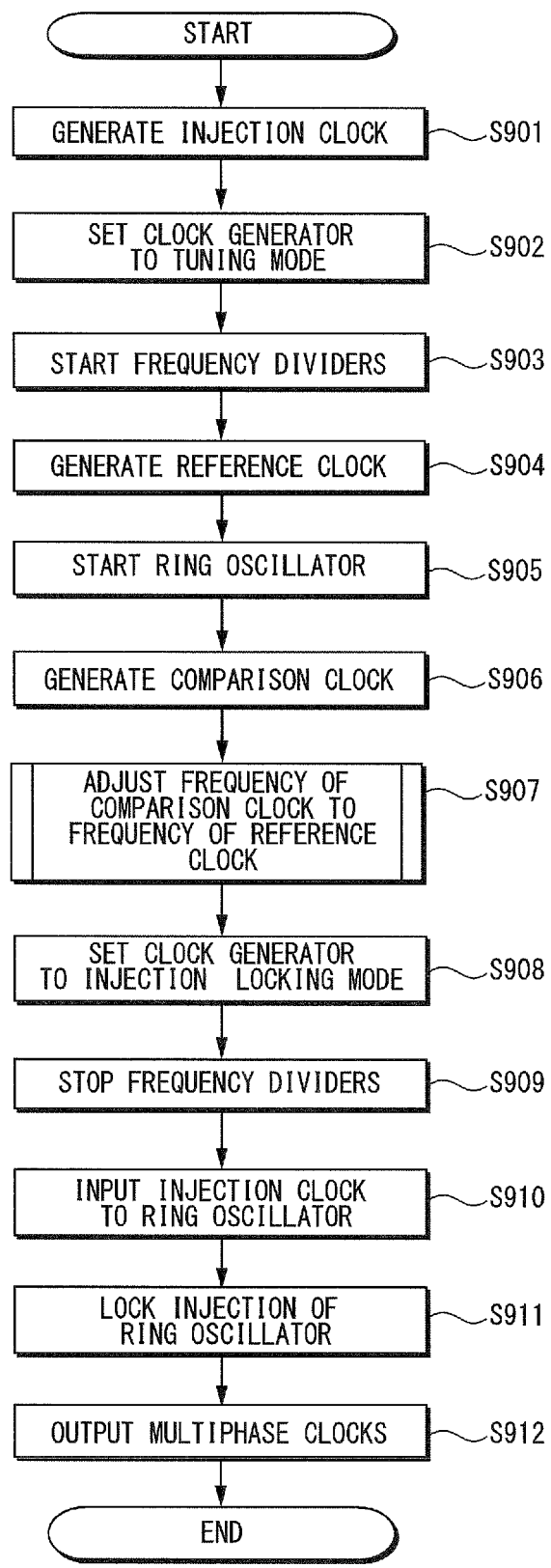
FIG. 9 is a flow chart for schematically showing operation of a clock generator according to an embodiment of the present invention.

FIG. 9 is a flow chart for schematically showing operation of a clock generator according to an embodiment of the present invention. As shown in FIG. 9, the injection clock generator 10 of the clock generator 1 may generate an injection clock IJ_CLK (S901) first. The clock generator 1 may then set the clock generator 1 to the tuning mode with controller 60 (S902).

The clock generator 1 may activate the frequency dividers 30 and 40 (S903). The frequency divider 40 may divide an injection clock IJ_CLK' by the frequency division number N to generate a reference clock REF_CLK (S904). The clock generator 1 may start the ring oscillator 20 (S905). The frequency divider 30 may divide a clock OCLK(1) output from the ring oscillator 20 that starts the self-oscillation by the frequency division number M to generate a comparison clock COMP_CLK (S906).

The frequency comparator 50 of the clock generator 1 may adjust the frequency of the clock OCLK(1) output by the ring oscillator 20 to adjust the frequency of the comparison clock COMP_CLK to the frequency of the reference clock REF_CLK (S907). Details of the process of step S907 will be described with reference to FIG. 10.

The clock generator 1 may next set itself to the injection locking mode (S908). The clock generator 1 may stop the frequency dividers 30 and 40, and stop comparison of a count of the reference clock REF_CLK and a count of the comparison clock COMP_CLK in the frequency comparator 50 (S909). The clock generator 1 may input the injection clock IJ_CLK to the ring oscillator 20 (S910), and lock the injection of the ring oscillator 20 (S911). The ring oscillator 20 of the clock generator 1 may output multiphase clocks OCLK(1) to OCLK(n) controlled at the frequency of the injection clock IJ_CLK.

Figure 10:
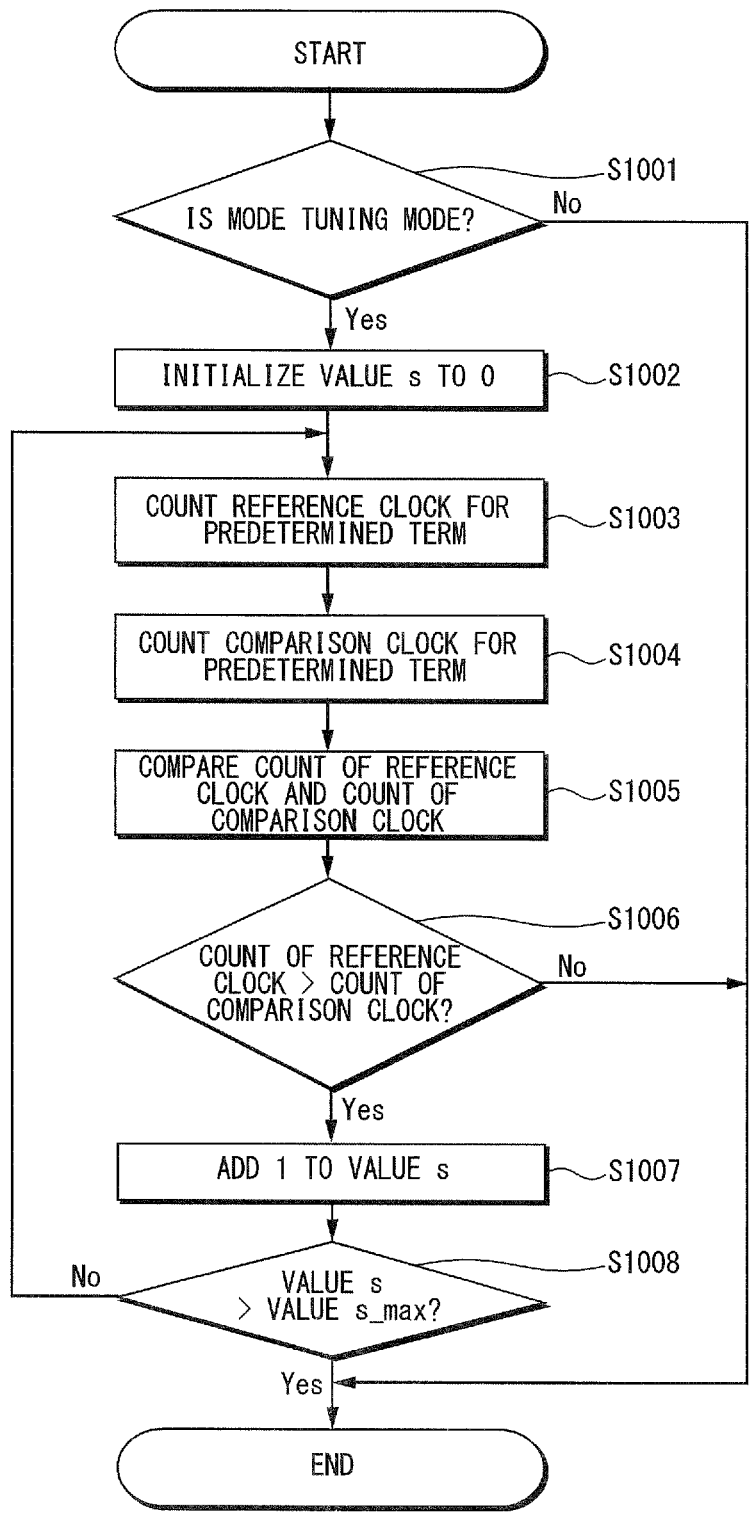
FIG. 10 is a flow chart for schematically showing operation of a clock generator according to an embodiment of the present invention.

FIG. 10 is a flow chart for schematically showing operation of a clock generator according to an embodiment of the present invention, and shows details of the process of step S907 in FIG. 9. The clock generator 1 may first determine whether the mode of the clock generator 1 is the tuning mode (S1001). If the clock generator 1 determines that the mode of the clock generator 1 is not the tuning mode (No in S1001), the clock generator 1 may end the process of adjusting the frequency of the comparison clock COMP-_CLK to the frequency of the reference clock REF_CLK. In contrast, if the clock generator 1 determines that the mode of the clock generator 1 is the tuning mode (Yes in S1001), the clock generator 1 may initialize a value s to, for example, 0 (S1002). The value s here may indicate a state of the delay control signal CNT_DEL.

The clock generator 1 may count the predetermined term based on the reference clock REF_CLK (S1003). The clock generator 1 may count the predetermined term based on the comparison clock COMP_CLK (S1004). The clock generator 1 may compare the count value of the reference clock REF_CLK and the count value of the comparison clock COMP_CLK (S1005).

The clock generator 1 may determine whether the count value of the reference clock REF_CLK is greater than the count value of the comparison clock COMP_CLK (S1006). If the clock generator 1 determines that the count value of the reference clock REF_CLK is not greater than the count value of the comparison clock COMP_CLK (No in S1006), the clock generator 1 may end the process of adjusting the frequency of the comparison clock COMP_CLK to the frequency of the reference clock REF_CLK. On the other hand, if the clock generator 1 determines that the count value of the reference clock REF_CLK is greater than the count value of the comparison clock COMP_CLK (Yes in S1006), the clock generator 1 may add 1 to the value s (S1007).

The clock generator 1 may determine whether the value s is greater than a value s_max (S1008). If the clock generator 1 determines that the value s is not greater than the value s_max (No in S1008), the clock generator 1 may return to the process of step S1003. On the other hand, if the clock generator 1 determines that the value s is greater than the value s_max (Yes in S1008), the clock generator 1 may end the process of adjusting the frequency of the comparison clock COMP_CLK to the frequency of the reference clock REF_CLK. The value s_max here may indicate a state of the delay control signal CNT_DEL that minimizes the delay time d of each stage of the ring oscillator 20.

As described above, the clock generator 1 may adjust the frequency of the self-oscillation of the ring oscillator 20 in the tuning mode to adjust the phases of the multiphase clocks OCLK(1) to OCLK(n) to the desired phases. The clock generator 1 may adjust the frequencies of the multiphase clocks OCLK(1) to OCLK(n) to the frequency of the injection clock IJ_CLK in the injection locking mode to thereby accurately control the phases of the multiphase clocks OCLK(1) to OCLK(n) while maintaining the frequencies constant. Since the clock generator 1 may determine the frequencies of the multiphase clocks OCLK(1) to OCLK(n) based on the ratio of the frequency division numbers M and N of the frequency dividers 30 and 40, the clock generator 1 may accurately control the phases of the multiphase clocks OCLK(1) to OCLK(n) without being affected by manufacturing variations. The clock generator 1 may include the tuning mode for controlling the phases of the multiphase clocks output by the ring oscillator 20 and the injection locking mode for controlling the frequencies of the multiphase clocks. The clock generator 1 may perform the control by switching these two modes.

Figure 11A:
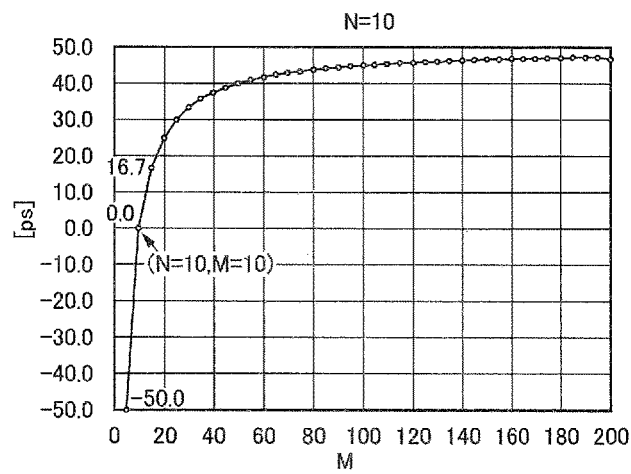
FIGS. 11A to 11C are diagrams showing relationships between frequency division numbers in frequency dividers of a clock generator and delay time of each stage of a ring oscillator according to an embodiment of the present invention.
Figure 11B:
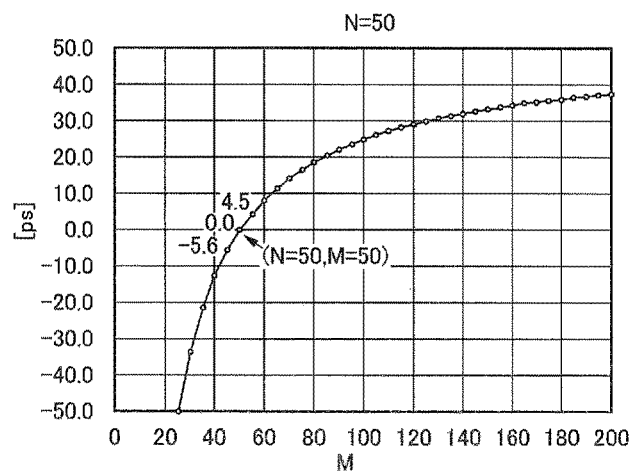
Figure 11C:
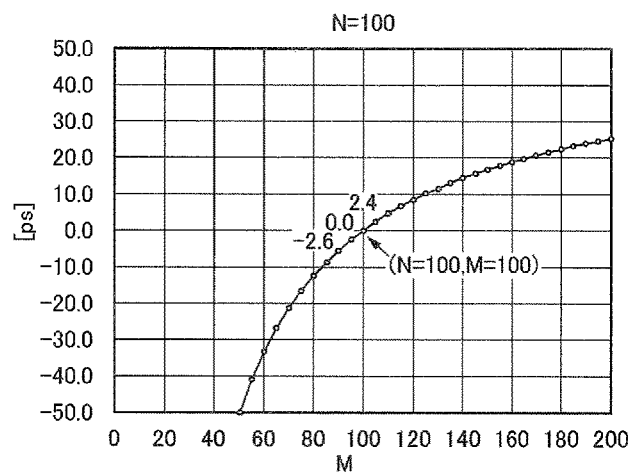

FIGS. 11A to 11C are diagrams showing relationships between the frequency division numbers in the frequency dividers of the clock generator and the delay time of each stage of the ring oscillator according to an embodiment of the present invention. Specifically, FIGS. 11A to 11C illustrate relationships between the frequency division number M in the frequency divider 30 and the delay difference Δt of the delay time d of each stage of the ring oscillator 20 when the value N indicating the frequency division number in the frequency divider 40 is 10, 50, and 100, respectively. In FIGS. 11A to 11C, it is assumed that the multiphase clocks OCLK include eight phases and that the frequency of the injection clock IJ_CLK is 5.0 GHz.

Referring to FIG. 11A, when the value of the frequency division number M is the same as the value of the frequency division number N (i.e., 10), a delay difference Δt of each stage of the ring oscillator 20 is 0, and a delay time d is the same time as ⅛ of the period T of the injection clock IJ_CLK. Therefore, it can be understood that each inverter circuit INV output the multiphase clocks OCLK(1) to OCLK(8) so that the phase difference between the clocks is ⅛ of the period T of the injection clock IJ_CLK.

When the frequency division number M is greater than the frequency division number N, the delay difference Δt of each stage of the ring oscillator 20 is greater than 0. Therefore, it can be understood that each inverter circuit INV output the multiphase clocks OCLK(1) to OCLK(8) by delaying the clocks by time equivalent to multiplications of the delay difference Δt relative to ⅛ of the period T.

When the frequency division number M is smaller than the frequency division number N, the delay difference Δt of each stage of the ring oscillator 20 is smaller than 0. Therefore, it can be understood that each inverter circuit INV output the multiphase clocks OCLK(1) to OCLK(8) by advancing the clocks by time equivalent to multiplications of the delay difference Δt relative to ⅛ of the period T. With reference to FIGS. 11B and 11C, it can be understood that the delay difference Δt can be more finely adjusted with an increase in the value of the frequency division number N.

As described above, the frequency dividers 30 and 40 may determine the delay time d of each stage of the ring oscillator 20 based on the frequency division numbers M and N. In this case, the frequency dividers 30 and 40 may adjust the delay difference Δt to a smaller value as the ratio of the frequency division numbers M and N approaches 1, and set the delay difference Δt to 0 when the frequency division numbers M and N coincide. The frequency dividers 30 and 40 may increase the accuracy of adjusting the delay difference Δt with an increase in the values of the frequency division numbers M and N. Specifically, the frequency dividers 30 and 40 may determine the delay difference Δt according to the following <Expression 1>.

$$(\text{Delay difference }\Delta t)=(T/8)\times(1-N/M) \quad \text{<Expression 1>}$$

When the frequency of the injection clock IJ_CLK is 5 GHz, the period of the injection clock IJ_CLK is 200 ps, and the value of T/8 in <Expression 1> is 25 ps. The frequency dividers 30 and 40 may set the phase difference between the multiphase clocks OCLK(1) to OCLK(8) to a value greater than 25 ps (i.e., delay the phases) if the frequency division number M is greater than the frequency division number N and may set the phase difference between the multiphase clocks OCLK(1) to OCLK(8) to a value smaller than 25 ps (i.e., advance the phases) if the frequency division number M is smaller than the frequency division number N. The frequency dividers 30 and 40 may set the phase difference between the multiphase clocks OCLK(1) to OCLK(8) to 25 ps if the frequency division number M is equal to the frequency division number N.

Figure 12A:
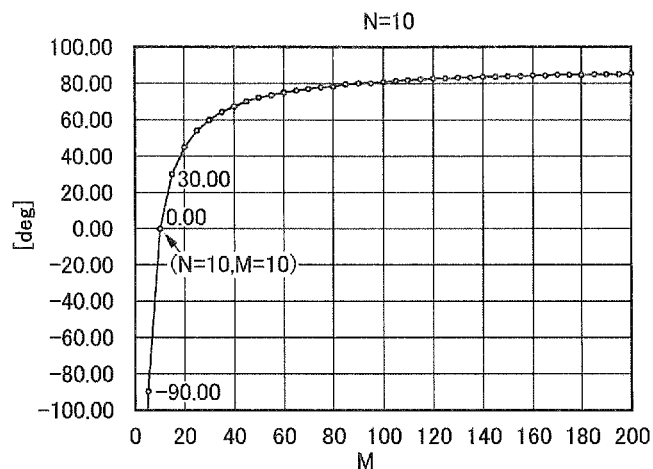
FIGS. 12A to 12C are diagrams showing relationships between the frequency division numbers in frequency dividers of a clock generator and a phase of a multiphase clock according to an embodiment of the present invention.
Figure 12B:
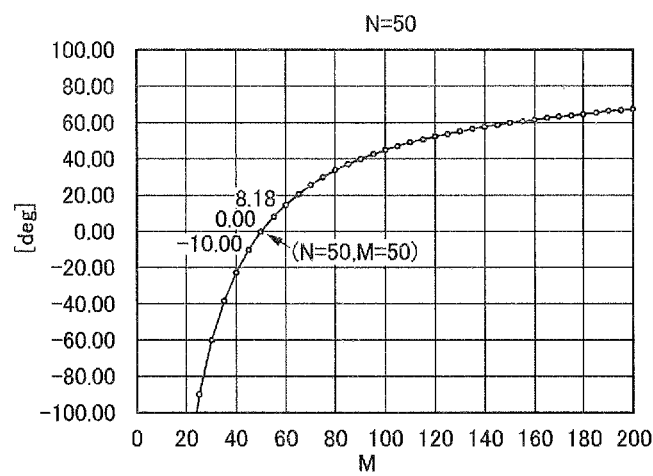
Figure 12C:
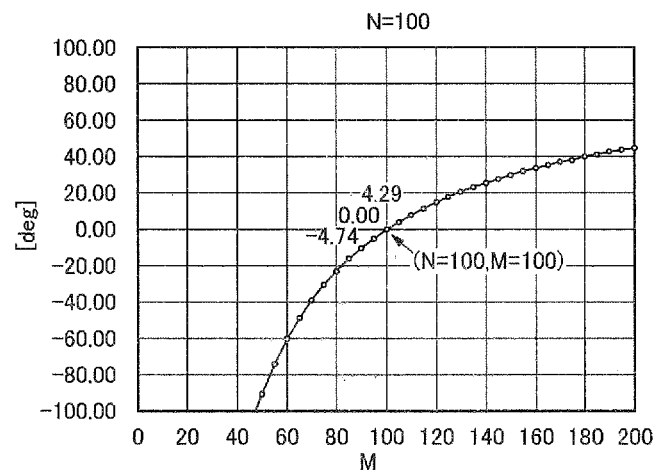

FIGS. 12A to 12C are diagrams showing relationships between the frequency division numbers in frequency dividers of a clock generator and a phase of a multiphase clock according to an embodiment of the present invention. Specifically, FIGS. 12A to 12C show relationships between the frequency division number M in the frequency divider 30 when the value N indicating the frequency division number in the frequency divider 40 is 10, 50, and 100, respectively, and the difference from the reference (i.e.) 90° of the phase of the clock OCLK(2) where the clock OCLK(8) is 0°. In FIGS. 12A to 12C, it is assumed that the multiphase clocks OCLK include eight phases and that the frequency of the injection clock IJ_CLK is 5.0 GHz.

Referring to FIG. 12A, when the value of the frequency division number M is the same as the frequency division number N (i.e., 10), the difference from the reference (i.e., 90°) of the phase of the clock OCLK(2) is 0°. Therefore, it can be understood that the inverter circuit INV2 outputs the clock OCLK(2) such that the phase of the clock is 90°.

When the frequency division number M is greater than the frequency division number N, the difference from the reference (i.e., 90°) of the phase of the clock OCLK(2) is greater than 0°. Therefore, it can be understood that the phase of the clock OCLK(2) is delayed relative to 90°. When the frequency division number M is smaller than the frequency division number N, the difference from the reference (i.e., 90°) of the phase of the clock OCLK(2) is smaller than 0°. Therefore, it can be understood that the phase of the clock OCLK(2) is advanced relative to 90°. With reference to FIGS. 12B and 12C, it can be understood that the phase of the clock OCLK(2) can be more finely adjusted with an increase in the value of the frequency division number N.

As described, the frequency dividers 30 and 40 may determine the phases of the multiphase clocks OCLK(1) to OCLK(3) and OCLK(5) to OCLK(7) based on the frequency division numbers M and N. The frequency dividers 30 and 40 may adjust the phases to closer to the references of the clocks (i.e. 45°, 90°, 135°, 225°, 270°, and 315° in this example) as the ratio of the frequency division numbers M and N approaches 1 and may adjust the phases to the references if the frequency division numbers M and N coincide. The frequency dividers 30 and 40 may increase the accuracy of adjusting the phases of the clocks with an increase in the values of the frequency division numbers M and N. The frequency dividers 30 and 40 may determine the phase difference of the multiphase clocks OCLK(1) to OCLK(3) and OCLK(5) to OCLK(7) according to, for example, the following <Expression 2>.

(Phase difference)=(360°/8)×(1−N/M)      <Expression 2>

The value of 360°/8 in <Expression 2> is 45°. The frequency dividers 30 and 40 may adjust the phase difference between the multiphase clocks OCLK(1) to OCLK(3) and OCLK(5) to OCLK(7) to a value greater than 45° (i.e. delay the phases) if the frequency division number M is greater than the frequency division number N and may adjust the phase difference between the multiphase clocks OCLK(1) to OCLK(3) and OCLK(5) to OCLK(7) to a value smaller than 45° (i.e. advance the phases) if the frequency division number M is smaller than the frequency division number N. The frequency dividers 30 and 40 may adjust the phase difference between the multiphase clocks OCLK(1) to OCLK(3) and OCLK(5) to OCLK(7) to 45° if the frequency division number M is equal to the frequency division number N.

As described, the clock generator 1 may adjust the frequency of the self-oscillation of the ring oscillator 20 in the tuning mode to adjust the phases of the multiphase clocks OCLK(1) to OCLK(3) and OCLK(5) to OCLK(7) to desired phases. The clock generator 1 may adjust the frequencies of the multiphase clocks OCLK(4) to OCLK(8) in the injection locking mode to the frequency of the injection clock IJ_CLK to accurately control the phases of the multiphase clocks OCLK(1) to OCLK(3) and OCLK(5) to OCLK(7) while maintaining the frequencies constant. Since the clock generator 1 may determine the frequencies of the multiphase clocks OCLK(1) to OCLK(3) and OCLK(5) to OCLK(7) based on the ratio of the frequency division numbers of the frequency dividers 30 and 40, the clock generator 1 may accurately control the phases of the multiphase clocks OCLK(1) to OCLK(3) and OCLK(5) to OCLK(7) without being affected by manufacturing variations. The clock generator 1 may include the tuning mode for controlling the phases of the multiphase clocks output by the ring oscillator 20 and the injection locking mode for controlling the frequencies of the multiphase clocks. The clock generator 1 may perform the control by switching these two modes.

The embodiments are provided to illustrate the present invention and are not intended to limit the present invention. The present invention can be implemented in various forms without departing from the scope of the present invention.

For example, the steps, the operations, or the functions may be implemented in parallel or in different orders in the methods disclosed in the present specification as long as the results are not inconsistent. The described steps, operations, and functions are just provided as examples, and some of the steps, the operations, and the functions may be omitted without departing from the scope of the invention or may be combined with each other. Other steps, operations, or functions may also be added.

Although various embodiments are disclosed in the present specification, specific features (technical matters) in one embodiment may be appropriately modified and added to other embodiments, or the specific features may be replaced with specific features in other embodiments. These modes are also included in the scope of the present invention.

The present invention can be widely used in the field of semiconductor integrated circuit.

What is claimed is:

1. A clock generator for generating and outputting multiphase clocks, comprising:
    an injection clock generator that generates an injection clock based on a predetermined system clock;
    a ring oscillator, including a plurality of inverter circuits connected in a circular pattern, that outputs, from the plurality of inverter circuits, clocks of the multiphase clocks provided with a predetermined delay time based on a predetermined delay control signal;
    a first frequency divider that divides the injection clock by a first value and outputs the clock as a reference clock;
    a second frequency divider that divides at least one of the multiphase clocks by a second value and outputs the clock as a comparison clock;
    a frequency comparator that compares a frequency of the reference clock and a frequency of the comparison clock and outputs the predetermined delay control signal based on a result of the comparison to the ring oscillator; and
    a controller that outputs a predetermined control signal,
    wherein the ring oscillator is configured to adjust the predetermined delay time of each of the plurality of inverter circuits based on the predetermined delay control signal, and
    wherein the controller controls:
    in a first mode, to output the injection clock to the ring oscillator and to output the multiphase clocks to the outside; and
    in a second mode, to output the injection clock to the first frequency divider and to output at least one of the multiphase clocks to the second frequency divider.

2. The clock generator according to claim 1, wherein each of the plurality of inverter circuits receives one of the multiphase clocks output from the inverter circuit of a previous stage, provides the one clock with the predetermined delay time based on the predetermined delay control signal, and outputs the one clock provided with the predetermined delay time to the inverter circuit of a next stage.

3. The clock generator according to claim 1,
    wherein when the predetermined control signal output from the controller indicates the first mode,
    the frequency comparator stores the result of the comparison, and
    the ring oscillator controls frequencies of the multiphase clocks such that the frequencies of the multiphase clocks become substantially the same as a frequency of the injection clock.

4. The clock generator according to claim 1, wherein the ring oscillator controls current flowing through each of the plurality of inverter circuits based on the predetermined delay control signal.

5. The clock generator according to claim 1, wherein the ring oscillator further comprises capacitive elements connected to each output terminals of the plurality of inverter circuits, wherein the ring oscillator controls capacitances of the capacitive elements based on the predetermined delay control signal.

6. A clock generator comprising:
an injection clock generator that generates an injection clock based on a predetermined system clock;
a ring oscillator, including a plurality of inverter circuits connected in a circular pattern, that outputs, from the plurality of inverter circuits, clocks of multiphase clocks provided with a predetermined delay time;
an adjustment circuit that adjusts the predetermined delay time provided to each of the plurality of inverter circuits in the ring oscillator based on the injection clock generated by the injection clock generator and based on at least one of the multiphase clocks generated by the ring oscillator; and
a control unit that selectively controls operation in a first mode for outputting the multiphase clocks generated by the ring oscillator to the outside and operation in a second mode for adjusting the predetermined delay time provided to each of the plurality of inverter circuits by the adjustment circuit,
wherein the controller controls:
in the first mode, to output the injection clock to the ring oscillator and to output the multiphase clocks to the outside; and
in the second mode, to output the injection clock to the adjustment circuit and to output at least one of the multiphase clocks to the adjustment circuit.

7. The clock generator according to claim 6, wherein the adjustment circuit comprises a frequency comparator that compares a frequency of a reference clock based on the injection clock and a frequency of a comparison clock based on at least one of the multiphase clocks, and outputs the predetermined delay control signal based on a result of the comparison to the ring oscillator.

8. The clock generator according to claim 7, wherein the adjustment circuit further comprises:
a first frequency divider that divides the injection clock by a first value and outputs the clock as the reference clock; and
a second frequency divider that divides at least one of the multiphase clocks by a second value and outputs the clock as the comparison clock.

9. The clock generator according to claim 6, wherein the controller selects the second mode before selecting the first mode.

10. The clock generator according to claim 9, wherein the controller selects the first mode when the result of the comparison indicates that the frequency of the comparison clock exceeds the frequency of the reference clock during the control of the operation in the second mode.

11. A method of adjusting phases of multiphase clocks output by a clock generator comprising a ring oscillator including a plurality of inverter circuits connected in a circular pattern, the method comprising:
generating an injection clock based on a predetermined system clock;
adjusting a predetermined delay time of the plurality of inverter circuits based on the injection clock; and
controlling frequencies of the multiphase clocks output by the ring oscillator such that the frequencies of the multiphase clocks become substantially the same as a frequency of the injection clock, wherein
the adjusting the predetermined delay time of the plurality of inverter circuits comprises:

comparing a frequency of a reference clock obtained by dividing the injection clock by a first value and a frequency of a comparison clock obtained by dividing at least one of the multiphase clocks output by the ring oscillator by a second value;
outputting a predetermined delay control signal based on a result of the comparison to the ring oscillator; and
determining the predetermined delay time of each of the plurality of inverter circuits based on the predetermined delay control signal, and
the comparing, the outputting, and the determining are repeated until the frequency of the comparison clock exceeds the frequency of the reference clock.

12. The method according to claim 11, wherein the determining the predetermined delay time comprises controlling current flowing through each of the plurality of inverter circuits based on the predetermined delay control signal.

13. The method according to claim 11, wherein the determining the predetermined delay time includes controlling capacitances of capacitive elements connected to output terminals of the plurality of inverter circuits based on the predetermined delay control signal.

14. A method of adjusting phases of multiphase clocks output by a clock generator comprising a ring oscillator comprising a plurality of inverter circuits connected in a circular pattern, the method comprising:
generating an injection clock based on a predetermined system clock;
adjusting the predetermined delay time provided to each of the plurality of inverter circuits in the ring oscillator based on the injection clock and at least one of the multiphase clocks generated by the ring oscillator;
outputting the injection clock to the ring oscillator after adjusting the predetermined delay time provided to each of the plurality of inverter circuits;
controlling frequencies of the multiphase clocks based on a frequency of the injection clock output to the ring oscillator; and
outputting the multiphase clocks with the controlled frequencies to the outside.

15. The method according to claim 14, wherein the adjusting the predetermined delay time includes:
comparing a frequency of a reference clock based on the injection clock and a frequency of a comparison clock based on at least one of the multiphase clocks;
generating a predetermined delay control signal based on a result of the comparison; and
adjusting the predetermined delay time based on the predetermined delay control signal.

16. The method according to claim 14, wherein the comparing the frequency of the reference clock and the frequency of the comparison clock includes:
generating the reference clock by dividing the injection clock by a first value; and
generating the comparison clock by dividing at least one of the multiphase clocks by a second value.

17. The method according to claim 14, wherein the adjusting the predetermined delay time comprises controlling current flowing through each of the plurality of inverter circuits based on the injection clock and at least one of the multiphase clocks.

18. The method according to claim 14, wherein the adjusting the predetermined delay time comprises controlling capacitances of capacitive elements connected to output terminals of the plurality of inverter circuits based on the injection clock and at least one of the multiphase clocks.

* * * * *